US005616980A

United States Patent [19]

Zumeris

[11] Patent Number: 5,616,980
[45] Date of Patent: *Apr. 1, 1997

[54] CERAMIC MOTOR

[75] Inventor: Jona Zumeris, Nesher, Israel

[73] Assignee: Nanomotion Ltd., Haifa, Israel

[*] Notice: The term of this patent shall not extend beyond the expiration date of Pat. No. 5,453,653.

[21] Appl. No.: 272,921

[22] Filed: Jul. 8, 1994

Related U.S. Application Data

[63] Continuation-in-part of Ser. No. 101,174, Aug. 3, 1993, Pat. No. 5,453,653.

[30] Foreign Application Priority Data

Jul. 9, 1993 [IL] Israel ......................... 106296
Apr. 22, 1994 [IL] Israel ......................... 109399

[51] Int. Cl.$^6$ ......................................... H01L 41/08
[52] U.S. Cl. ........................ 310/323; 310/317; 310/366
[58] Field of Search ........................... 310/323, 328, 310/366, 316, 317

[56] References Cited

U.S. PATENT DOCUMENTS

| | | | |
|---|---|---|---|
| 2,875,354 | 2/1959 | Harris | 310/358 |
| 3,684,904 | 8/1972 | Galotva et al. | 310/328 |
| 3,902,084 | 8/1975 | May, Jr. | 310/328 |
| 3,952,215 | 4/1976 | Sakitani | 310/328 |
| 4,195,243 | 3/1980 | Thaxter | 310/328 X |
| 4,523,121 | 6/1985 | Takashi et al. | 310/358 X |
| 4,562,374 | 12/1985 | Sashida | 310/323 |
| 4,570,098 | 2/1986 | Tomita | 310/346 |
| 4,831,494 | 6/1989 | Banno | 310/358 X |
| 4,953,413 | 9/1990 | Iwata et al. | 310/328 X |
| 5,006,749 | 4/1991 | White | 310/323 |
| 5,027,027 | 6/1991 | Orbach et al. | 310/328 X |
| 5,073,739 | 10/1991 | Iijima et al. | 310/323 |
| 5,121,025 | 6/1992 | Toda | 310/323 X |
| 5,130,599 | 7/1992 | Toda | 310/323 |
| 5,200,665 | 4/1993 | Ijima | 310/323 |
| 5,268,621 | 12/1993 | Hamers et al. | 310/328 X |
| 5,325,010 | 6/1994 | Besocke et al. | 310/328 X |

FOREIGN PATENT DOCUMENTS

| | | | |
|---|---|---|---|
| 0536832 | 4/1993 | European Pat. Off. | |
| 0239875 | 10/1987 | Japan | 310/323 |
| 0283473 | 11/1988 | Japan | 310/323 |
| 0209962 | 8/1989 | Japan | 310/323 |
| 0041673 | 2/1990 | Japan | 310/323 |
| 0055585 | 2/1990 | Japan | 310/323 |
| 0084076 | 3/1990 | Japan | 310/323 |
| 0188169 | 7/1990 | Japan | 310/323 |
| 5-3688 | 1/1993 | Japan. | |
| 693493 | 10/1979 | U.S.S.R. | |
| 0817816 | 4/1981 | U.S.S.R. | 310/323 |

OTHER PUBLICATIONS

Patent Abstracts of Japan vol. 017 No. 261 (E–1369), 21 May 1993 & JP–A–05 003688 (Omron Corp.) 8 Jan. 1993 *abstract*.

*Primary Examiner*—Mark O. Budd
*Attorney, Agent, or Firm*—Darby & Darby, P.C.

[57] ABSTRACT

A micromotor for moving a body including at least one rectangular piezoelectric plate having long and short edges and first and second faces, electrodes attached to the first and second faces and a ceramic spacer attached to the center of a first one of the edges and operative to be pressed against the body. A resilient force is applied to the center of a second edge opposite the first edge, whereby the ceramic spacer is pressed against the body. At least some of the electrodes are electrified by either an AC or an asymmetric unipolar pulsed voltage.

16 Claims, 15 Drawing Sheets

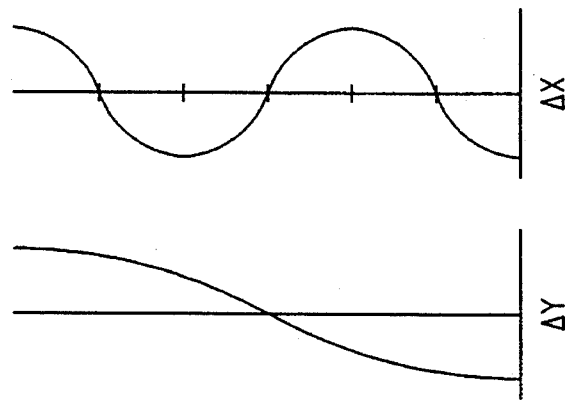
FIG.1D
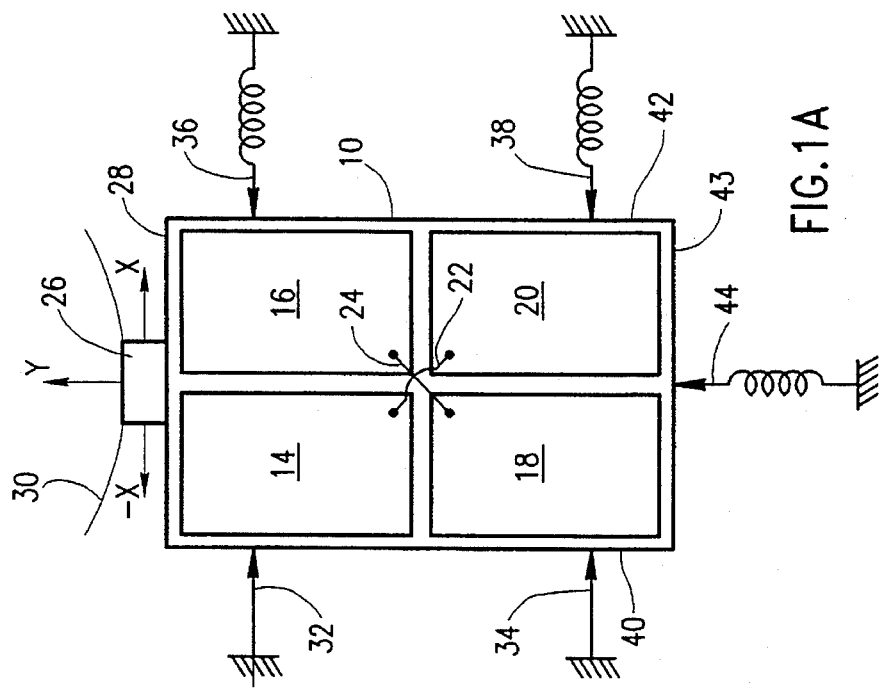
FIG.1A
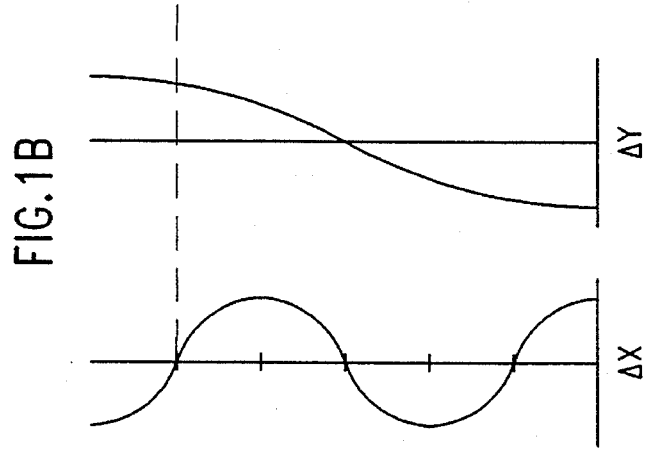
FIG.1B
FIG.1E
FIG.1C

CERAMIC MOTOR

RELATED APPLICATION

This application is a continuation-in-part of U.S. patent application Ser. No. 8/101,174, filed Aug. 3, 1993, now U.S. Pat. No. 5,453,653.

FIELD OF THE INVENTION

This invention relates to micro-motors and more particularly to piezoelectric motors.

BACKGROUND OF THE INVENTION

The use of resonant piezoelectric ceramics to provide linear and rotational motion is well known. The major advantages of such systems is the capability of achieving very fine motion without the use of moving mechanical parts. In general such systems are limited to 1 micrometer of motion accuracy in open loop operation and 50 nanometers in closed loop operation. The velocity is limited to 5 to 10 mm/sec when the weight of a plate to be moved is 0.5 kg. Under these circumstances the force applied to the plate in the direction of motion is limited to about 5N. It would be useful in many situations to achieve better resolution, higher velocities and greater motional drive force for such motors. Improved resolution would be especially useful if the ability to move at relatively high velocities was also preserved.

SU 693493 describes a piezoelectric motor comprising a flat rectangular piezoelectric plate having one electrode covering essentially all of one large face of the plate (the "back" face) and four electrodes each covering a quadrant of the front face. The back electrode is grounded and diagonal electrodes are electrically connected. Two ceramic pads are attached to one of the long edges of the plate and these pads are pressed against the object to be moved by a spring mechanism which presses against the other long edge.

The long and short directions have nearby resonant frequencies (for different mode orders) such that when one pair of connected electrodes is excited with an AC voltage to which the ceramic is responsive, the object moves in one direction, and when the other pair is excited the object moves in the other direction.

SUMMARY OF THE INVENTION

It is an object of some aspects of the present invention to provide a micromotor having higher speed, greater driving force and smaller minimum step size than micromotors of the prior art.

One aspect of the present invention comprises a thin rectangular piezoelectric ceramic having at least one electrode on one of the large faces thereof and a plurality of electrodes on the other large face. Preferably, a single spacer of hard material is attached to the center of the short edge of the piezoelectric ceramic and is pressed against a body. When at least some of the electrodes are electrified, as described below, movement of either the piezoelectric ceramic or the body along the length of the edge of the piezoelectric ceramic occurs.

In one embodiment of this aspect of the invention, the dimensions of the rectangular large face are preferably chosen such that the piezoelectric ceramic has closely spaced resonances for x and y (the dimensions of the large rectangular face of the piezoelectric ceramic), albeit in different modes. Preferably the resonances have overlapping response curves.

Excitation of the piezoelectric ceramic is achieved by connecting an AC voltage at a frequency at which both modes are excited to selected ones of the plurality of electrodes. In this embodiment, the resonant excitation is applied for at least some minimal period if a small displacement is required and can be applied for a longer period if greater displacement is required.

In a second embodiment of this aspect of the invention, the excitation is a non-resonant non-symmetrical pulse of voltage to certain of the plurality of electrodes. The present inventor has found that when such a pulse, for example, a triangular pulse having a relatively higher rise than fall time, is used, extremely small motion can be achieved. Such excitation is especially useful where it is desired that no residual voltage remain on the electrodes after the motion.

In a third embodiment of this aspect of the invention, the excitation is switched between resonant AC excitation for relatively large steps and pulsed, preferably triangular, excitation, when small steps are required.

A number of electrode configurations are possible in accordance with the invention. In one configuration, the plurality of electrodes comprise two rectangular electrodes, each covering half of one of the rectangular surfaces of the piezoelectric ceramic, and lying along the long direction of the large rectangular face of the ceramic.

A second preferred electrode configuration provides four electrodes which cover the four quarters of the large face of the piezoelectric ceramic. One, two or three of these electrodes can be excited, where the different modes of excitement (AC and Pulsed) and excitement configurations result in larger or small minimum step sizes for the movement caused by the motor.

Another aspect of the invention includes the use of a plurality of stacked piezoelectric ceramics, which have the same resonant frequencies, but which are preferably fabricated of different piezoelectric materials, one of which is substantially softer than the other. The ceramics having different hardnesses are driven by out of phase signals at the same frequency. In such a system, the harder material provides a high driving force during the part of the cycle in which it drives the body and the softer material provides a longer contact time but with a smaller force. This combination allows for a high starting drive to overcome inertia and static friction forces, combined with a smooth operation during movement.

There is therefore provided, in a preferred embodiment of the invention, a micromotor for moving a body comprising:

at least one rectangular piezoelectric plate having long and short edges and first and second faces, electrodes attached to the first and second faces and a ceramic spacer attached to a first one of the edges, preferably at the center thereof and preferably to a short edge thereof, and operative to be pressed against the body;

a source of resilient force applied to a second edge opposite the first edge, preferably to the center thereof and pressing the ceramic spacer against the body; and a voltage source which electrifies at least some of the electrodes.

In a preferred embodiment of the invention the voltage source electrifies at least some of the electrodes with asymmetric unipolar pulsed excitation.

Preferably, the voltage source is operative to selectively electrify some of the electrodes with either asymmetric unipolar pulsed or AC excitation.

In a preferred embodiment of the invention the electrodes comprise a plurality of electrodes on the first face of the piezoelectric plate, preferably comprising an electrode in each quadrant thereof, and at least one electrode on the second face.

In a preferred embodiment of the invention electrodes in the quadrants along one long edge of the first face of the plate are electrified with a unipolar asymmetrical pulsed voltage of a first polarity and electrodes in the quadrants along the other long edge of the first face are electrified with a unipolar asymmetrical pulsed voltage of opposite polarity.

Alternatively, electrodes in the respective quadrants closest to the ceramic spacer are electrified with unipolar asymmetrical pulsed voltages of opposite polarities or electrodes in the respective quadrants further from the ceramic spacer are electrified with unipolar asymmetrical pulsed voltages of opposite polarities.

In a preferred embodiment of the invention electrodes in a first pair of diagonally situated quadrants are electrified with a unipolar asymmetrical pulsed voltage of a given polarity and, preferably, electrodes in a second pair of diagonally situated quadrants are electrified with a unipolar asymmetrical pulsed voltage of a polarity opposite that of the given polarity.

In a preferred embodiment of the invention the micromotor comprises a plurality of said piezoelectric plates, the ceramic spacer of each of the plates being resiliently pressed against the body. Preferably, at least one of the plurality of plates is formed of a relatively harder piezoelectric material and at least one of the plurality of plates is formed of a relatively softer piezoelectric material. In a further preferred embodiment of the invention the voltage source is operative to electrify at least one of the plurality of plates out of phase with each other.

There is further provided, in accordance with a preferred embodiment of the invention, a micromotor for moving a body comprising:

at least one rectangular piezoelectric plate having long and short edges and first and second faces and having electrodes attached to the first and second faces, at least some of the electrodes being electrified with asymmetric unipolar pulsed excitation; and a source of resilient force which resiliently urges one of the edges or one or more extensions of the edge against the body.

There is further provided, in accordance with a preferred embodiment of the invention, a micromotor for moving a body comprising:

at least one rectangular piezoelectric plate having long and short edges and first and second faces and having electrodes attached to the first and second faces;

a source of resilient force which resiliently urges one of the edges or one or more extensions of the edge against the body; and a voltage source operative to selectively electrify at least some of the electrodes with asymmetric unipolar pulsed excitation or AC excitation.

There is further provided, in accordance with a preferred embodiment of the invention, a micromotor for moving a body comprising:

a plurality of rectangular piezoelectric plates having long and short edges and first and second faces and having electrodes attached to the first and second faces, at least some of the electrodes on each plate being electrified; and a source of resilient force which urges one of the edges or one or more extensions of the edge of each of the plurality of plates against the body.

There is further provided, in accordance with a preferred embodiment of the invention, a micromotor for moving a body comprising:

at least one rectangular piezoelectric plate having long and short edges and first and second faces and having electrodes attached to the first and second faces, one of said electrodes being energized with a voltage which causes a force essentially only toward one edge of the plate and at least one of the other electrodes is energized with a voltage which causes movement of at least a portion of said edge having a component along said edge.

There is further provided, in accordance with a preferred embodiment of the invention, a micromotor for moving a body comprising:

a plurality of rectangular piezoelectric plates having long and short edges and first and second faces and having electrodes attached to the first and second faces, at least some of the electrodes on each plate being electrified, said rectangular plate having holes therein spaced along a central longitudinal axis thereof; and at least one lever having one end thereof rotatably mounted in the hole.

Preferably, the other end of the lever is rotatably mounted on a fixed plate or, alternatively, on a plate which is constrained to move only in the direction of said axis.

BRIEF DESCRIPTION OF THE DRAWINGS

The present invention will be understood and appreciated more fully from the following detailed description, taken in conjunction with the drawings in which:

FIG. 1A is a simplified view of a piezoelectric ceramic element useful in a motor in accordance with a preferred embodiment of the present invention;

FIGS. 1B and 1C show a first excitation configuration (1C), in accordance with a preferred embodiment of the invention, for the element of FIG. 1 together with mode plots (1B) for that configuration;

FIGS. 1D and 1E show a second excitation configuration (1E), in accordance with a preferred embodiment of the invention, for the element of FIG. 1 together with mode plots (1D) for that configuration;

DETAILED DESCRIPTION OF PREFERRED EMBODIMENTS

Figure 2:
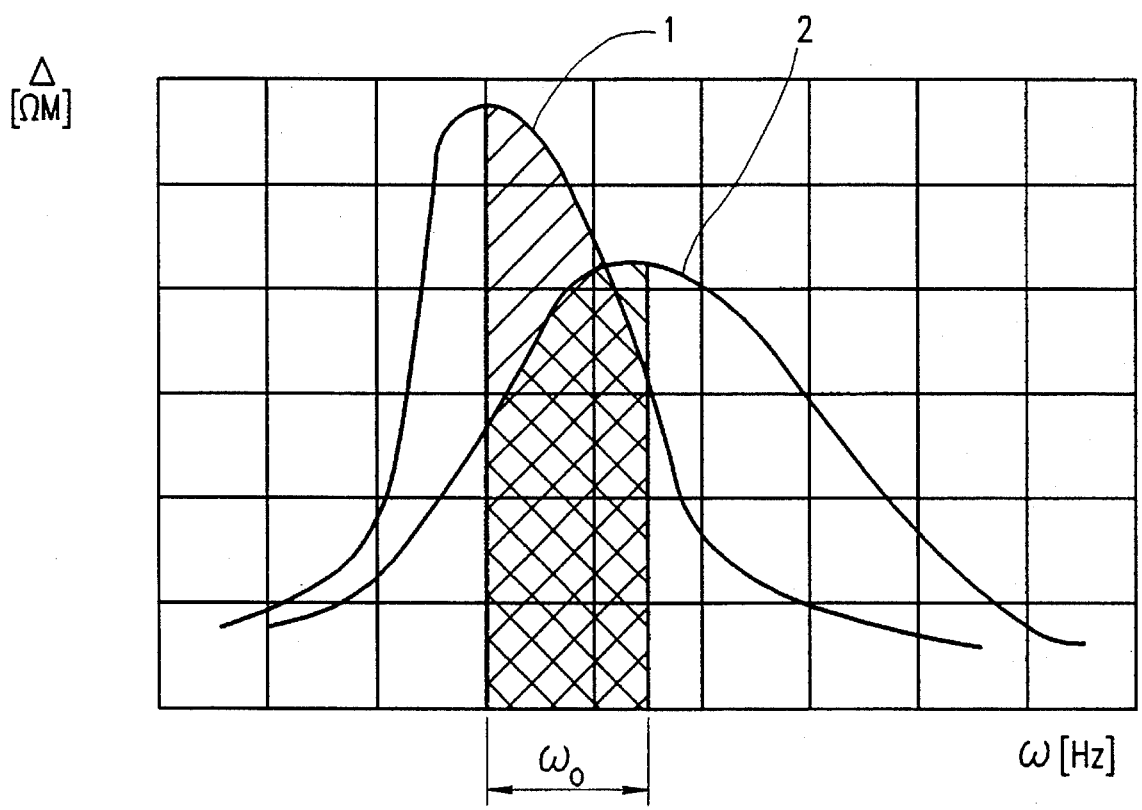
FIG. 2 shows resonance curves for two closely spaced resonant modes of the element of FIG. 1, in accordance with a preferred embodiment of the invention.

Reference is made to FIG. 1A which shows one large face of a relatively thin rectangular piezoelectric ceramic 10 for use in a motor in accordance with a preferred embodiment of the invention. Four electrodes 14, 16, 18 and 20 are plated or otherwise attached onto the face (hereinafter, "the first face") of the piezoelectric ceramic to form a checkerboard pattern of rectangles, each substantially covering one-quarter of the first face. The opposite face of the piezoelectric ceramic (hereinafter "the second face") is substantially fully covered with a single electrode (not shown). Diagonally located electrodes (14 and 20; 16 and 18) are electrically connected by wires 22 and 24 preferably placed near the junction of the four electrodes. The electrode on the second face is preferably grounded. Alternatively, the electrodes can be connected by printed circuit techniques similar to those used to form the electrodes.

A relatively hard ceramic spacer 26 is attached, for example with cement, to a short edge 28 of piezoelectric ceramic 10, preferably at the center of the edge.

Piezoelectric ceramic 10 has a large number of resonances. In particular, the dimensions of piezoelectric ceramic 10 are chosen such that resonances for $\Delta x$ and $\Delta y$ are closely spaced and have overlapping excitation curves as shown in FIG. 2. In particular, the resonances which are preferred in accordance with the present invention are a one-half (½) mode resonance for $\Delta y$ and a one and one-half (1½) mode resonance for $\Delta x$ as shown in FIGS. 1B and 1D. However, other resonances can be used depending on the dimensions of ceramic 10.

When piezoelectric ceramic 10 is excited by a frequency within the band indicated as $\omega_o$ in FIG. 2, both the $\Delta x$ and $\Delta y$ resonances will be excited. FIG. 1C shows one configuration for electrifying certain electrodes thereby exciting the two resonances. In this configuration, in which electrodes 16 and 18 are electrified and electrodes 14 and 20 are left floating (or less preferably, grounded), the mode amplitudes are shown in FIG. 1B. Excitation in this configuration causes $\Delta x$ to be negative when $\Delta y$ is positive, resulting in leftward movement of a body 30 which is pressed against piezoelectric ceramic 10 if piezoelectric ceramic 10 is constrained from movement. While the surface of body 30 is shown as being curved, such as the surface of a cylinder which is to be rotated, it can also be flat when linear motion is desired.

For the excitation configuration shown in FIG. 1E in which electrodes 14 and 20 are electrified and 16 and 18 are left floating (or less preferably, grounded), the $\Delta y$ mode is the same, but the $\Delta x$ mode is reversed in phase, causing movement to the right.

In a preferred embodiment of the invention, piezoelectric ceramic 10 is constrained from movement by a pair of fixed supports 32 and 34 and two spring loaded supports 36 and 38. Supports 32–38 contact piezoelectric ceramic 10 at points of zero movement in the x direction along a pair of long edges 40 and 42 of the ceramic. These supports are designed to slide in the y direction.

Such spring loading is provided to reduce the effects of wear and to provide a degree of shock protection for the piezoelectric ceramic.

A spring loaded support 44 is preferably pressed against the middle of a second short edge 43 of piezoelectric ceramic 10 opposite short edge 28. Support 44 supplies pressure between ceramic 26 and body 30 which causes the motion of ceramic 26 to be transmitted to body 30. It should be understood that spring loaded support 44 has a much slower time response than frequency at which piezoelectric ceramic 10 is excited. Thus, the face of ceramic 26 which is pressed against body 30 actually moves away from the body during part of the cycle when ceramic 26 is moving opposite the direction of motion applied to body 30.

In a preferred embodiment of the invention, spring loaded supports 36, 38 and 44 are stiff solid rubber cylinders (springs), preferably of Silicone rubber preferably having a Shore A hardness of about 60. In practice such "springs" can be fabricated by cutting a portion of an O-Ring (such as those marketed by Parker-Hannifin) to a desired size. Preferably, the resonance of the springs should be far from the piezoelectric ceramics used. In a preferred embodiment of the invention, a hard spherical or hemispherical element is placed between the spring element and the ceramic.

In a preferred embodiment of the invention, the dimensions of piezoelectric ceramic 10 are 30 mm×7.5 mm with a thickness of between 2 and 5 mm when PZT piezoelectric material manufactured by Morgan Matroc Inc. is used. For this configuration, 30–500 volts of AC may be used to excite piezoelectric ceramic 10, depending on the speed desired, the weight of body 30 (and/or the pressure of spring 44) and the power required. Such a device operates at a frequency in the range of 20–100 kHz, has a minimum step size in the range of 10 nanometers (nm) and a maximum velocity of about 15–350 mm/sec (or more). These are nominal ranges only and may vary depending on the material used for piezoelectric ceramic 10, the dimensions, the resonant mode which is selected and other factors.

In practice the larger dimension of the ceramic can be between 20 mm and 80 mm and the smaller dimension can be between 3 mm and 20 mm. For example a very long and thin device (e.g., 3 mm×80 mm) would result in a motor with a very high speed.

Preferably, ceramic spacer 26 should not affect the resonant modes of the system. One way of achieving this is to make the spacer extremely thin. However, this method is often not practical. A more practical solution, in accordance with a preferred embodiment of the invention, is to make the length of the spacer very nearly equal to an integral multiple of a half wavelength. In practice it should be within 1/10 of such ideal length. The number of half wavelengths should preferably be less than or equal to 5. Furthermore, the ceramic spacer should have the same longitudinal wavelength as the ceramic. A preferred ceramic for spacer 26 is 99% Alumina. In practice a ceramic spacer having a length of approximately 4–5 mm has been found to be suitable for this purpose.

In the embodiments described above in conjunction with FIGS. 1 and 2, excitation of piezoelectric ceramic 10 in FIG. 1A is by an AC voltage near the resonances of the piezoelectric ceramic. In the method depicted in FIGS. 3 and 4, the excitation is by a pulsed unipolar voltage. In this pulsed excitation embodiment of the invention, electrodes 14, 16, 18 and 20 are not connected together in a fixed manner as in the embodiment of FIG. 1, but are connected in different ways, depending on the minimum step required, as described below.

Figure 3:
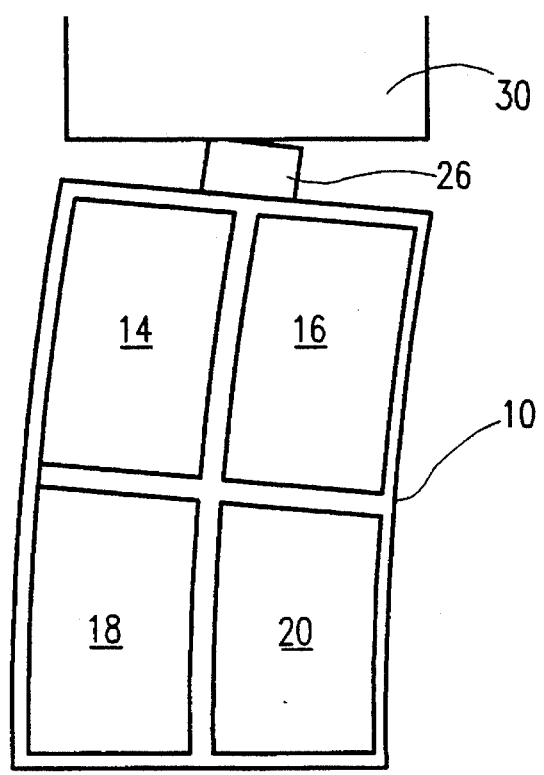
FIG. 3 shows a representation of a bi-morphological movement of a piezoelectric element useful in a motor in accordance with a preferred embodiment of the invention.

The principle by which the pulsed method operates is shown in FIG. 3. In this figure, electrodes 14 and 18 are excited by a positive DC voltage and electrodes 16 and 20 are excited by a negative DC voltage with respect to the electrode on the second side of piezoelectric ceramic 10. Under this excitation the left side of piezoelectric ceramic 10 becomes longer than the right side (shown greatly exaggerated in FIG. 3) and ceramic 26 moves to the right. Of course when the voltage is removed, the ceramic will move back to its original position. Alternatively only one of the pairs of electrodes is electrified and the other pair is either grounded or allowed to float.

In an alternative embodiment of pulsed operation of the motor, electrodes 14 and 16 are electrified to the same voltage and electrodes 18 and 20 are electrified to a voltage having the opposite polarity (or are grounded or allowed to float). Such electrification will also result in very small movement.

Figure 4:
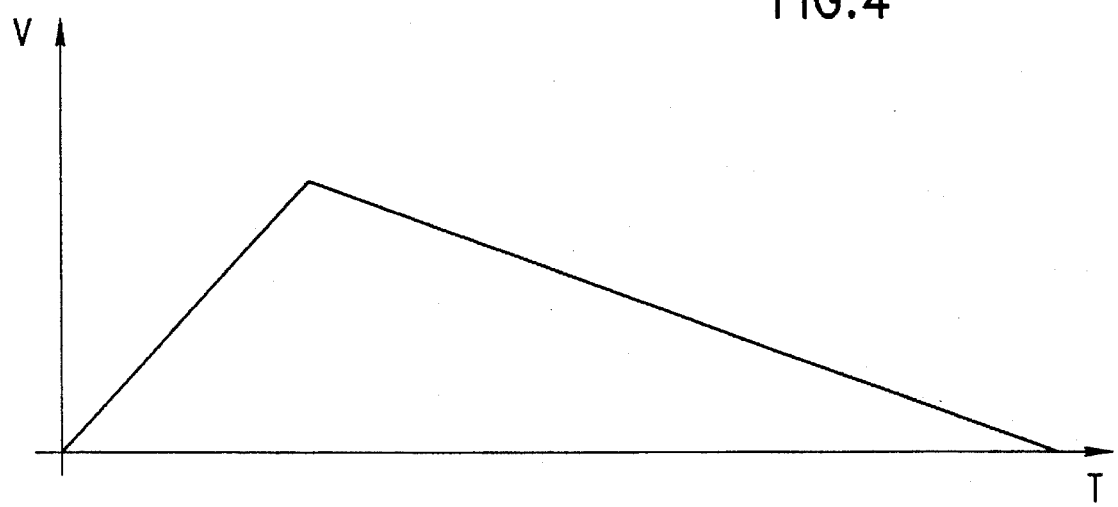
FIG. 4 is a voltage pulse which, when applied to electrodes on the element shown in FIG. 3, caused controlled motion of a body in contact with the element.

However, the present inventor has found that, if a non-symmetrical voltage pulse, such as that shown in FIG. 4, is applied to the electrodes, then, during the return to zero, the body will not to return with ceramic 26 to the starting position. Preferably the fall time of the pulse should be at least four times as long as the rise time. A total pulse time of 10 to 50 milliseconds is preferred, but the exact times will depend on the mass which is moved by the piezoelectric ceramic and on the force of spring 44. Under experimental conditions rise time of 1 micro second and a fall time of 15 millisecond gave excellent results. The minimum step for this configuration will depend on the pulse voltage and can vary from 2–6 nm for peak voltages of 30–100 volts, with a larger minimum step for greater masses due to the increased inertia of the mass. This mode is generally not used for large movements but is most useful for final placement of the object to be moved. Reversing the polarity of the excitation or applying a pulse having slow rise time and a fast fall time results in travel in the opposite direction. While the operation of the body in this mode is not well understood, extremely small minimum steps can be achieved.

Other configurations of excitation of the electrodes with such pulsed voltages yield other minimum step values. For example, excitation of electrode 14 with a positive pulse and electrode 16 with a negative pulse (while grounding electrodes 18 and 20 or allowing them to float, will result in a minimum step of about 2–5 nm. Excitation of electrodes 18 and 20 with respective positive and negative pulses (while preferably allowing 14 and 16 to float) will result in a minimum step of 5–8 nm. A similar value of minimum step is achieved when electrodes 14 and 18 are pulsed with one polarity and electrode 20 is pulsed with the opposite polarity (electrode 16 is floating). Alternatively, the electrodes which are indicated above as floating can be grounded, however, this will result in a lower efficiency.

In a particularly useful differential mode, electrodes 14 and 20 are pulsed positive and electrodes 16 and 18 are grounded, allowed to float or are pulsed negative. In this mode very small minimum movements can be achieved in the range of 0.1–2 nm. The diagonal electrodes may be pulsed with voltages of the same or differing amplitudes.

While the pulsed excitation is preferably utilized with the configuration shown in FIG. 8, it is also useful when applied to configurations of the prior art such as that of SU 693493 described above, where each of the electrodes is separately excitable.

In a preferred embodiment of a motor according to the invention, piezoelectric ceramic 10 is first excited by an AC voltage as described in conjunction with FIGS. 1 and 2 to produce fast movement to the vicinity of a target position and is then excited by pulsed voltages as described in conjunction with FIGS. 3 and 4. One preferred embodiment of a motor system including provision for such excitation is shown in block diagram form in FIG. 5.

Figure 5:
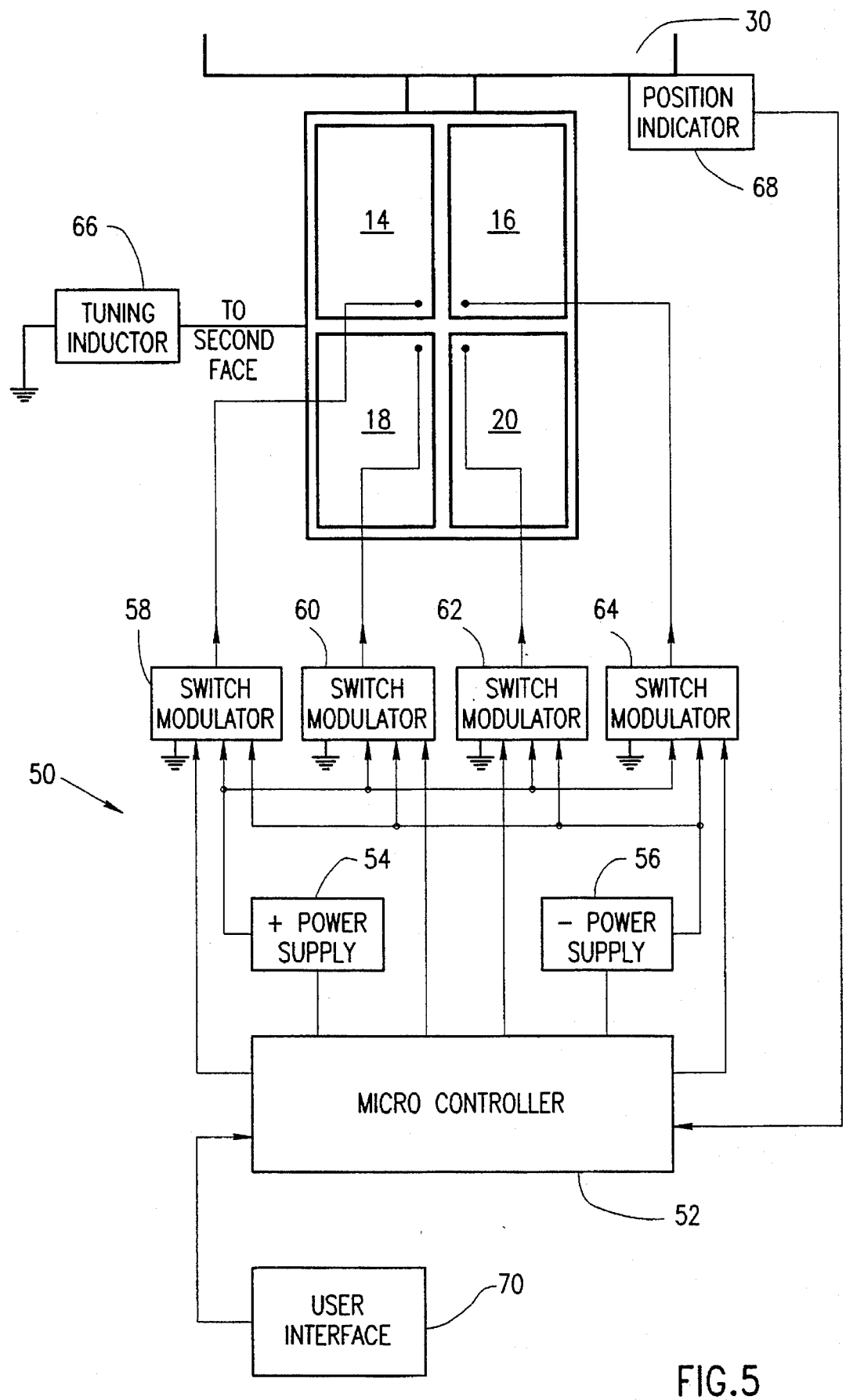
FIG. 5 is a partially schematic, partially block diagram of a motor for achieving controlled motion in accordance with a preferred embodiment of the invention.

As shown in FIG. 5, a control system 50 comprises a controller, for example, a microcontroller 52 which controls the energizing of a pair of regulated power supplies 54 and 56 respectively and four switch/modulator circuits 58, 60, 62 and 64. Each of the switch modulators is connected to one of electrodes 14, 16, 18 or 20. The electrode on the second face is connected to ground, preferably via a tuning inductor 66.

Microcontroller 52 preferably receives position signals from a position indicator 68, which indicates the position of body 30 and provides feedback to microcontroller 52. Microcontroller 52 also preferably receives position (or movement) and, optionally, velocity commands from a user interface 70.

In operation, microcontroller 52 receives a position command from user interface 70 and compares it to the actual position indicated by indicator 68. If the command is a movement command, the position is only noted for later comparison.

Microcontroller 52 notes the amount of movement which is required and based on predetermined optimization criteria, decides if the AC or pulsed mode is appropriate and in which direction the body most move. Appropriate signals are sent to the switch/modulators so that they produce either AC or pulsed voltages (or no voltage or ground) to each of the electrodes such that piezoelectric ceramic 10 operates in an appropriate excitation configuration as described above. When the remaining distance to be traveled is reduced below an appropriate level, microcontroller 52 switches to a high resolution, low speed mode utilizing appropriate pulsed excitation as described above in conjunction with FIGS. 3 and 4. Several changes in excitation regime may be appropriate when high position accuracies are desired. When body 30 arrives at the target destination, the excitation of the electrodes is terminated.

Inductor 66 is used to tune the electrical resonance of piezoelectric ceramic 10 and its associated wiring to the same frequency as the mechanical resonances of piezoelectric ceramic 10. Since the electrical circuit consists largely of the capacitance formed by the electrodes on the first and second faces of piezoelectric ceramic 10, it is appropriate to add an inductor, such as inductor 66 to "tune-out" this capacitance and improve the efficiency of the system.

While motion control Of the system has been described with respect to a closed loop system, open loop operation is possible, at lower accuracy. For closed loop operation, it is believed that the system can achieve accuracies better than about 0.5 nm. For open loop operation, the amount of movement can be estimated fairly closely and the position can be controlled to within about 0.1% to 1% of the total amount of motion.

In a preferred embodiment of a motor in accordance with the invention, a plurality of piezoelectric ceramics can be configured to increase the power of the motor and to reduce any variability which exists between different units. One such configuration, shown in FIG. 6, includes two piezoelectric ceramics 10 and 10' in a tandem configuration, i.e., one in which the two ceramics are mounted in tandem in the direction of motion induced by piezoelectric ceramics 10 and 10'. The two piezoelectric ceramics can be driven by a common control system such as control system 50 shown in FIG. 5 or by separate control systems. For clarity, the control systems and electrical connections are not shown in FIG. 6.

Figure 6:
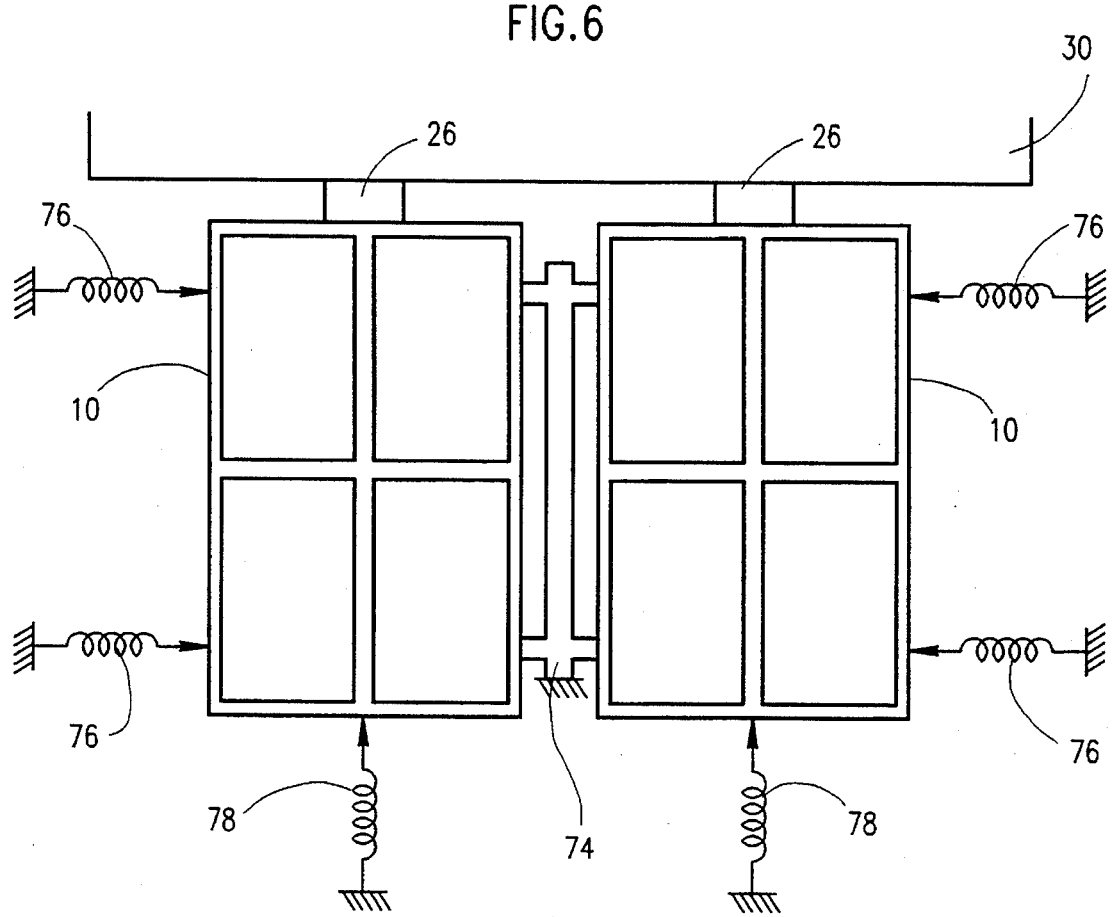
FIG. 6 is a schematic drawing of a tandem configuration of piezoelectric ceramic elements useful in a motor in accordance with a preferred embodiment of the invention.

As shown in FIG. 6, a spacer unit 74 located intermediate piezoelectric ceramics 10 and 10', supports and separates the piezoelectric ceramics. Four spring loaded side supports 76 and two spring loaded end supports 78 support the pair of piezoelectric ceramics in much the same way as described above with respect to the embodiment of FIG. 1. In practice piezoelectric ceramics 10 and 10' are also constrained from moving perpendicular to the face of the piezoelectric ceramics, preferably by extensions of spacer unit 74 and spring loaded supports 76 and 78. Such constraints are shown in FIG. 7.

Figure 7:
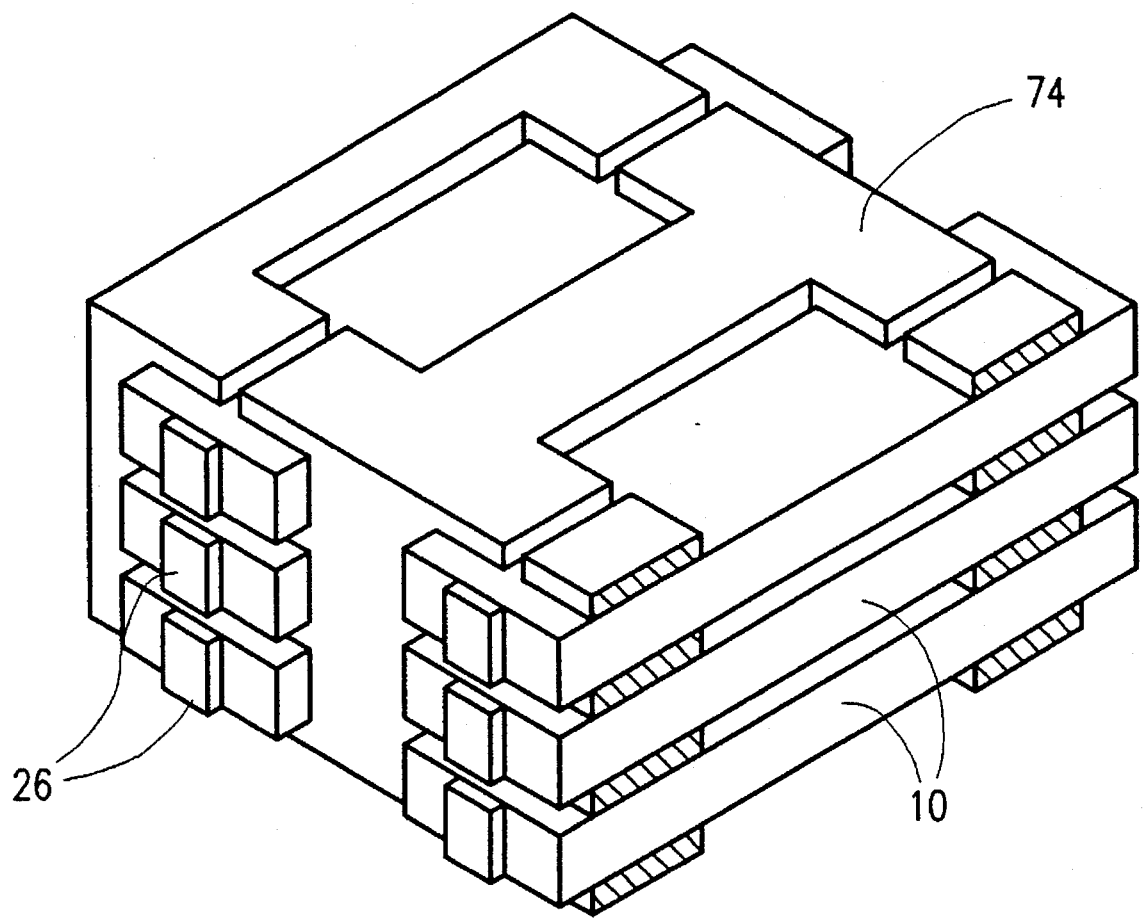
FIG. 7 is a schematic drawing of a tandem/parallel configuration of piezoelectric ceramic elements useful in a motor in accordance with a preferred embodiment of the invention.

FIG. 7 shows six piezoelectric ceramics configured in a 2 by 3 unit tandem/parallel configuration. Due to pictorial constraints, the spring loaded supports and the mechanism for pressing spacer unit 74 against the piezoelectric ceramics are not shown, however, the preferred support mechanism is that shown in FIG. 6. Other configurations, such as a 2×4 tandem/parallel configuration are also useful.

In a preferred embodiment of a motor in accordance with the invention, the piezoelectric ceramics used in the embodiments shown in FIGS. 6 and 7 are not all the same. In this embodiment of the invention, one or more of the piezoelectric ceramics is made from a relatively hard material such as PZT-8 (manufactured by Morgan Matroc Inc.) and one or more of the piezoelectric ceramics is made from a softer material such PZT-5H (manufactured by Morgan Matroc). The two types of materials can be physically configured such that they have the same x and y dimensions and the same resonances and resonant frequencies can be obtained by adjusting the thickness of the various piezoelectric ceramics. Alternatively, the same thickness can be used for both materials. In such a configuration the broader Q of the soft material will assure that both the harder and softer materials are adequately excited at the same frequency.

When the softer piezoelectric ceramic is electrified, the amplitude of the resonance is greater in both $\Delta x$ and $\Delta y$ and the portion (time) of the period during which ceramic 26 contacts the body is greater than for the harder piezoelectric ceramic. However, by its nature, the amount of motive force which the softer piezoelectric ceramic applies is lower and the unevenness of the motion is also lower.

In a preferred embodiment of the invention, where both types of piezoelectric ceramic are used, as described in the previous paragraph, the harder piezoelectric ceramic is operative to overcome static friction and other inertial forces and the softer piezoelectric ceramic is operative to give a smoother, more accurate, motion with smoother stops and starts than when only a hard piezoelectric ceramic is used.

In a preferred embodiment of the invention, the two types of ceramic are excited out of phase with each other (180° phase difference). In this way, the two types of piezoelectric ceramic act in an essentially independent manner (at different parts of the excitation cycle) and there is a minimum of friction due to the differing motions of the two types of piezoelectric ceramic. In a preferred embodiment of the invention, the phase reversal is achieved by using ceramics with reversed polarization directions for the two ceramics. Alternatively, the voltages can be applied out of phase. Reversed phase operation of the ceramics is also useful when two piezoelectric ceramics of identical characteristics are used.

X-Y motion having all of the advantages of the present invention is also possible.

Figure 8B:
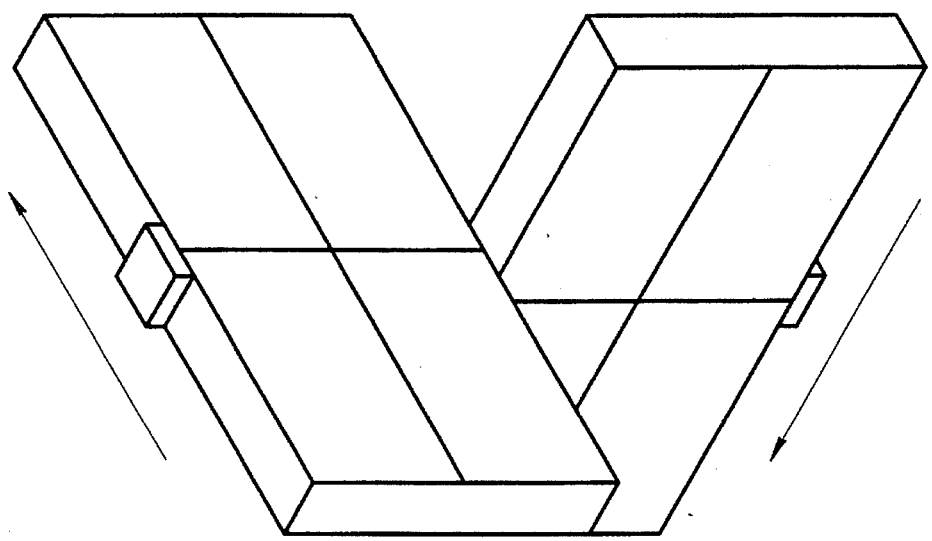
FIG. 8B is a schematic drawing of two piezoelectric ceramic elements configured and adapted for x-y motion in accordance with an alternative preferred embodiment of the invention.
Figure 8A:
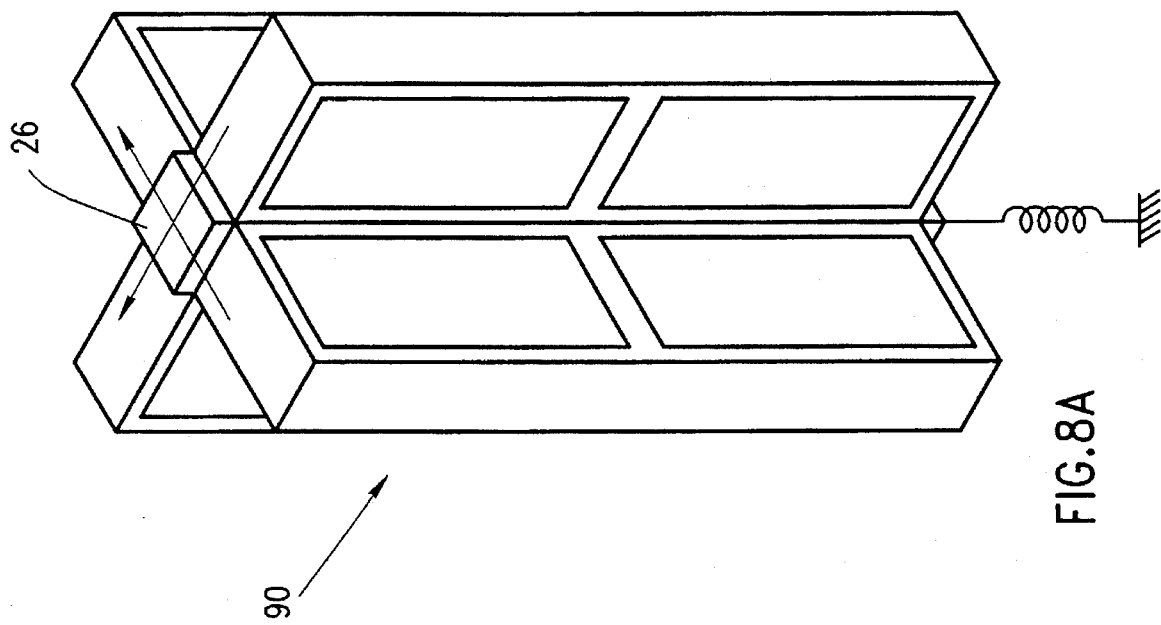
FIG. 8A is a schematic drawing of a piezoelectric ceramic element configured and adapted for x-y motion in accordance with a preferred embodiment of the invention.

One configuration for producing X-Y motion is shown in FIG. 8A. An integral X-shaped section 90 is formed of piezoelectric ceramic material and has front and back electrodes formed on the larger flat internal faces of the section. The internal faces which are not shown (and which oppose the faces which are fully or partially shown) are supplied with a single electrode running the entire face. These single electrodes are grounded (or alternatively connected to the system power supply common return), in accordance with a preferred embodiment of the invention, and the electrodes which are shown are activated in accordance with the schemes previously described. To construct an X-Y table with such a device would only require holding the ceramic as described above in accordance with FIGS. 1 and 7 and adding a flat table contacting ceramic 26. A number of such x-shaped sections 90 of the same or different ceramics may be used in a parallel-tandem configuration as described above with respect to FIGS. 6 and 7.

FIG. 8B shows a second, simpler to visualize, but less compact configuration in which two piezoelectric ceramics such as those shown in FIG. 1 are cemented together to achieve x motion at one end and y motion at the other end.

Figure 8C:
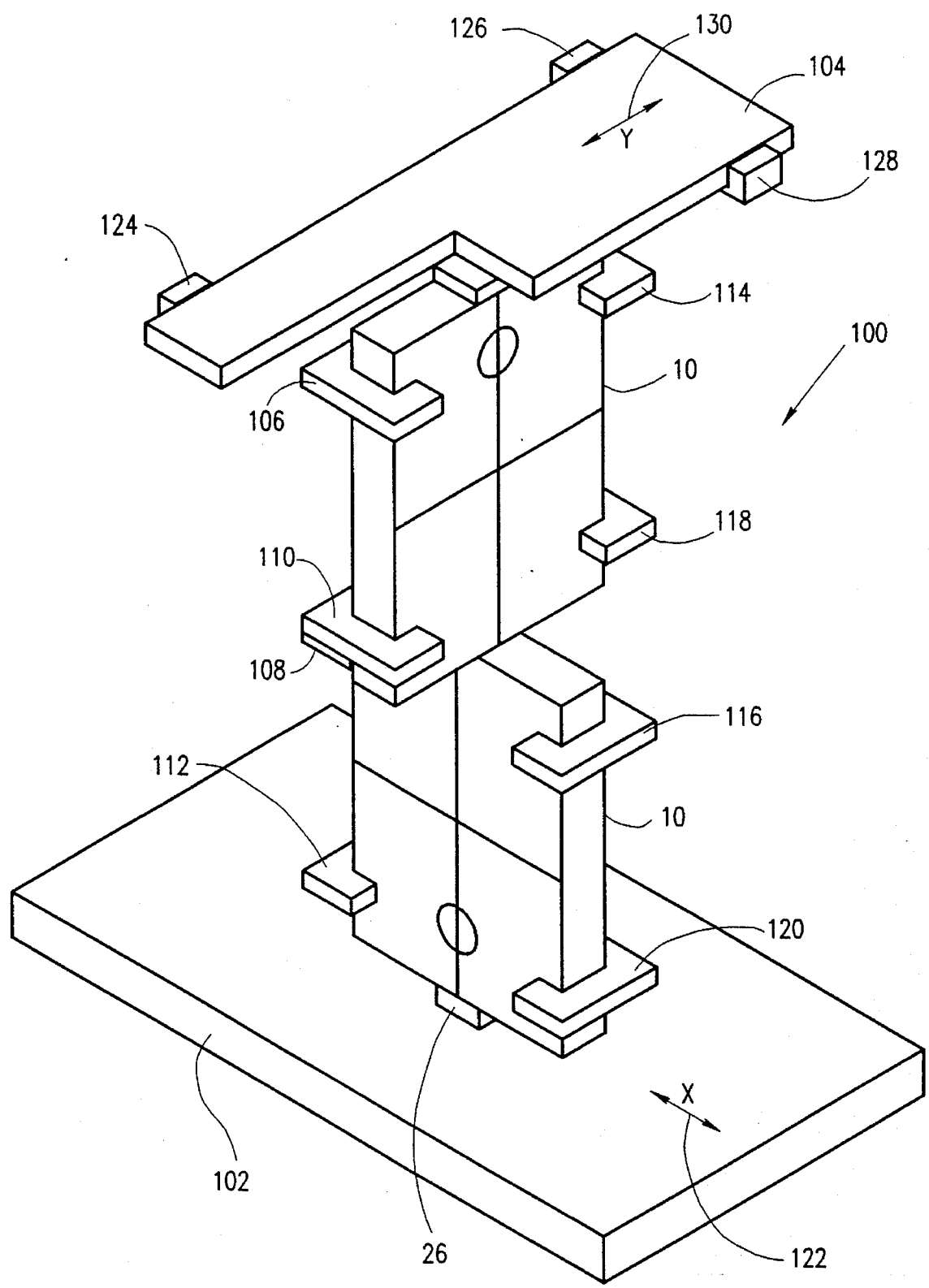
FIG. 8C is a schematic partial drawing of an x-y table utilizing the embodiment of FIG. 8B.

An x-y table 100 constructed in accordance with a preferred embodiment of the present invention and using the configuration of FIG. 8B is shown in simplified form in FIG. 8C. Table 100 comprises two piezoelectric ceramics 10 in the configuration of FIG. 8B sandwiched between a fixed base 102 and a top 104. Supports 106, 108, 110, 112, 114 and 116, 118 and 120 are similar in form and function to supports 32, 34, 36 and 38 of FIG. 1. All of supports 106–120 are mounted together on a fixture (not shown for clarity of presentation) but are not attached to base 102. However, sliders which allow for sliding movement in the x-direction (shown by arrows 122) between the fixture and base 102 are preferably provided and are attached to the fixture.

A set of sliders 124, 126 and 128 are provided for allowing motion of top 104 with respect to the fixture in the y direction shown by arrows 130. Preferably sliders 124–128 are attached to the fixture.

In summary, the fixture includes supports for the upper and lower piezoelectric ceramics 10 and sliders which allow sliding motion of the fixture with respect to base 102 in the x direction and of top 104 with respect to the fixture in the y direction.

In operation, activation of the lower piezoelectric ceramic causes it to move in the x direction. Since top 104 is constrained by the fixture from movement in the x direction with respect to the fixture, top 104 moves by the same amount as the fixture in the x direction. Thus, activation of the lower piezoelectric ceramic causes x motion of top 104. When the upper piezoelectric ceramic is activated, top 104 moves in the y direction with respect to the fixture. Since the fixture is constrained from any movement in the y direction with respect to the base, top 104 moves with respect to base 102.

Selective activation of the upper and lower piezoelectric ceramics results in x-y motion of top 104 with respect to base 102, having all of the advantages of the embodiments for linear motion shown above with respect to the embodiments of FIGS. 1–7. Activation of only one of the piezoelectric ceramics results in motion in only one direction.

Using the principles outlined above x, y, z motion or x, y, θ motion or motion along a plurality of nonorthogonal axes is possible, using a different ceramic to provide motion along each of the axes.

Furthermore, tandem and series arrangements of piezoelectric ceramics of differing or the same hardness will result in similar improvements to those described, with respect to FIGS. 6 and 7, for such tandem arrangements with respect to linear motion devices.

Figure 9:
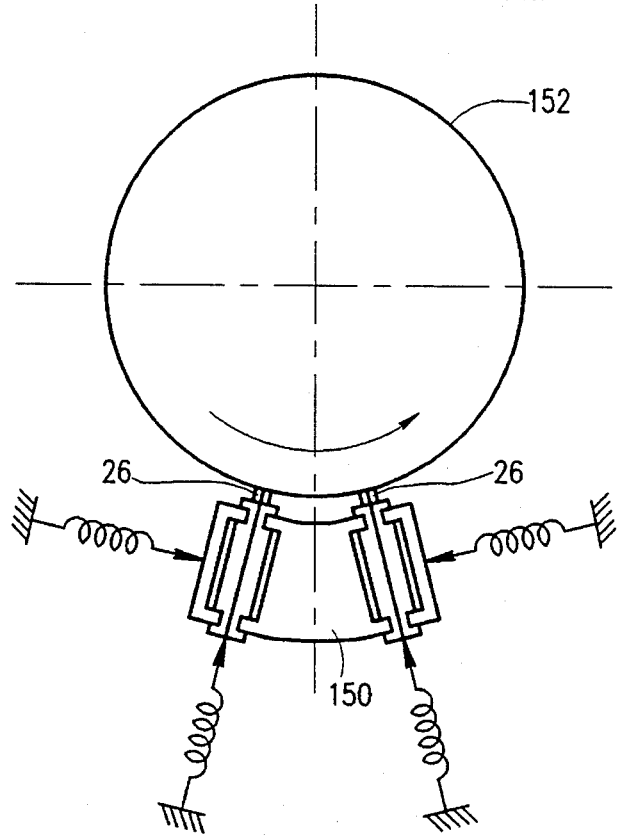
FIG. 9 shows the use of piezoelectric ceramic elements in accordance with a preferred embodiment of the invention configured to rotate a cylinder or a sphere.

Use of piezoelectric ceramics in accordance with the present invention to achieve rotational motion is shown in FIG. 9, in which a tandem configuration of piezoelectric ceramics 150 similar to that shown in FIG. 6 is adapted to conform with and rotate a cylinder 152. In such a configuration, the surfaces of ceramic spacers 26 would preferably have a concave shape conforming with the surface of cylinder 152. A single piezoelectric ceramic similar to that shown in FIG. 1 or any number of circularly arranged piezoelectric ceramics can also be used in place of configuration 150.

When circular motion and three-axis positioning of a sphere are required, a configuration such as that of FIG. 9 would be used modified by providing three orthogonally placed ceramic structures similar to configuration 150 to revolve and position the sphere. If only rotation (and not three-axis positioning) is required, two orthogonal drivers would be sufficient. In this embodiment, the outer surface of ceramic 26 would be shaped to conform with the surface of the sphere.

Utilizing the present invention, an improved combination of velocity, accuracy, and driving force is possible. By utilizing only a single ceramic pad 26, greater force can be employed to push the ceramic against body 30 over the prior art which is subject to cracking when excessive force is used. Use of tandem ceramics unexpectedly results in a large increase in driving force and velocity. In general, both higher velocities and higher driving force can be simultaneously achieved in the present invention for the same volume of piezoelectric ceramic.

Figure 10:
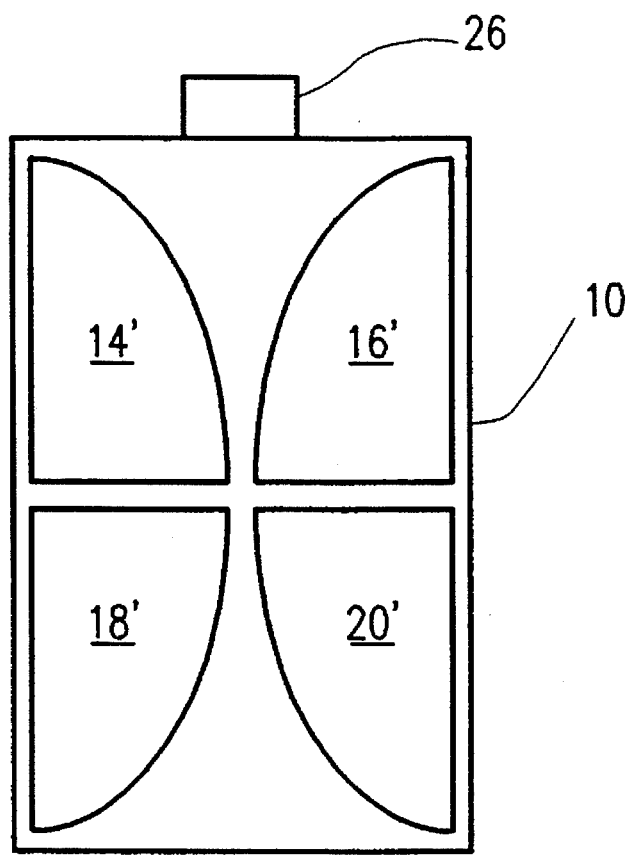
FIGS. 10 shows an alternative electrode shape for a piezoelectric ceramic in accordance with a preferred embodiment of the invention.

The present inventor has also found that, when rectangular electrodes are used as shown in the above embodiments, the motion is not completely linear, i.e., due to the rotational nature of the motion of ceramic 26, only one part of the ceramic will touch body 30 during operation. Linearity can be improved by shaping the electrodes as, for example, shown in FIG. 10, where 14', 16', 18' and 20' are linearizing versions of the unprimed electrodes shown in the previous figures. While a sinusoidal variation is shown in FIG. 10, other electrode configurations are also possible to improve the linearity of the device.

Figure 11A:
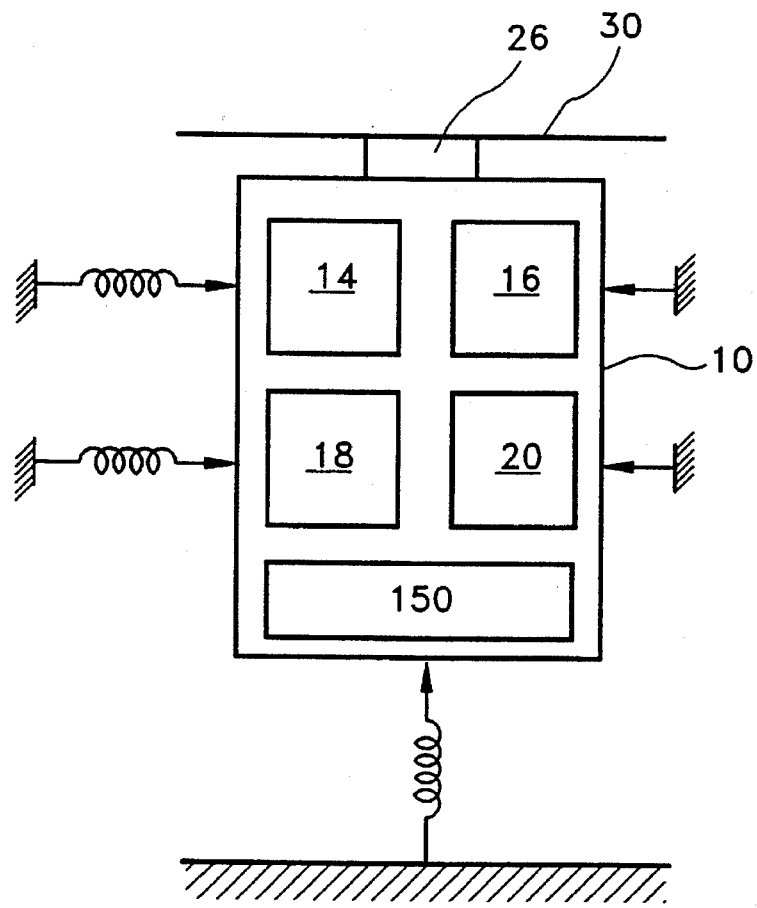
FIG. 11a, 11b, and 11c show various embodiments of an electrode configuration suitable for applying a preloading force of the piezoelectric ceramic against a body to be moved.
Figure 11B:
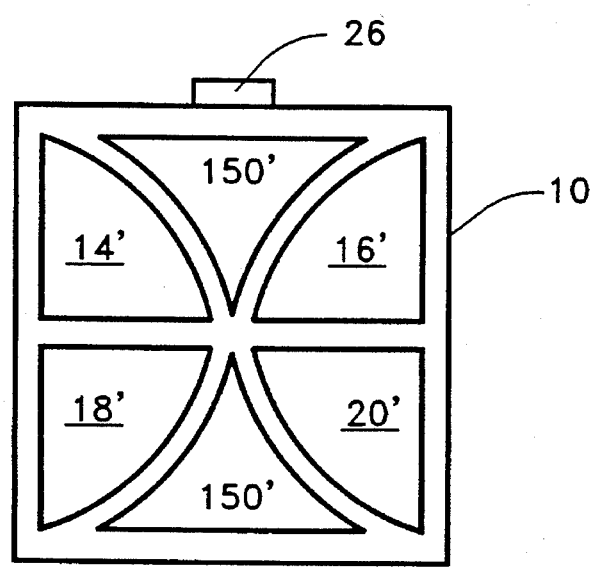
Figure 11C:
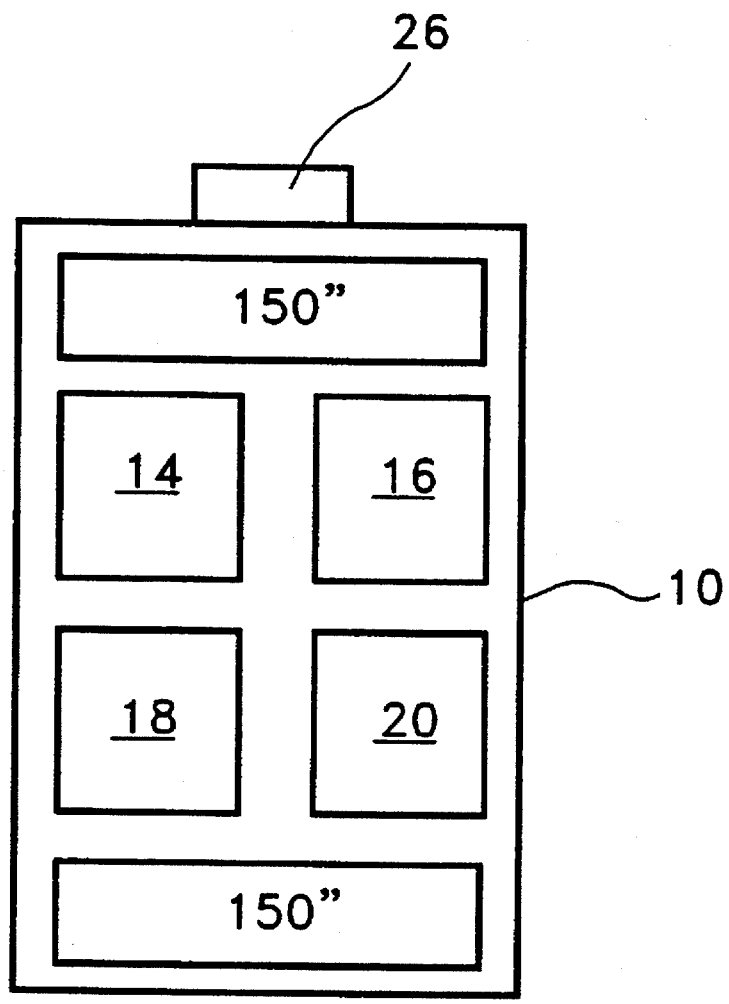

In preferred embodiments of the invention the electrode configuration shown in FIGS. 11a, 11b, and 11c are used.

For this embodiment an additional electrode 150, in addition to electrodes 14, 16, 18 and 20 is applied to piezoelectric ceramic 10. Electrode 150, which preferably extends along substantially the entire width of ceramic 10 is energized by DC voltage or by a harmonic of the voltages used on the other electrodes. The effect of such energization is to elongate ceramic 10 and to effect pre-loading of the motor against the object to be moved. By using harmonic excitation this pre-loading can be synchronized with the excitation of the other electrodes to give an increased contact time between ceramic 26 and the object being moved. While in principle it may be possible to omit spring 44 from such a system, in practice the use of some resilient loading (which responds much more slowly than the piezoelectric ceramic) is useful and may even be required. FIGS. 11B and 11C show alternative electrode configurations.

Figure 12:
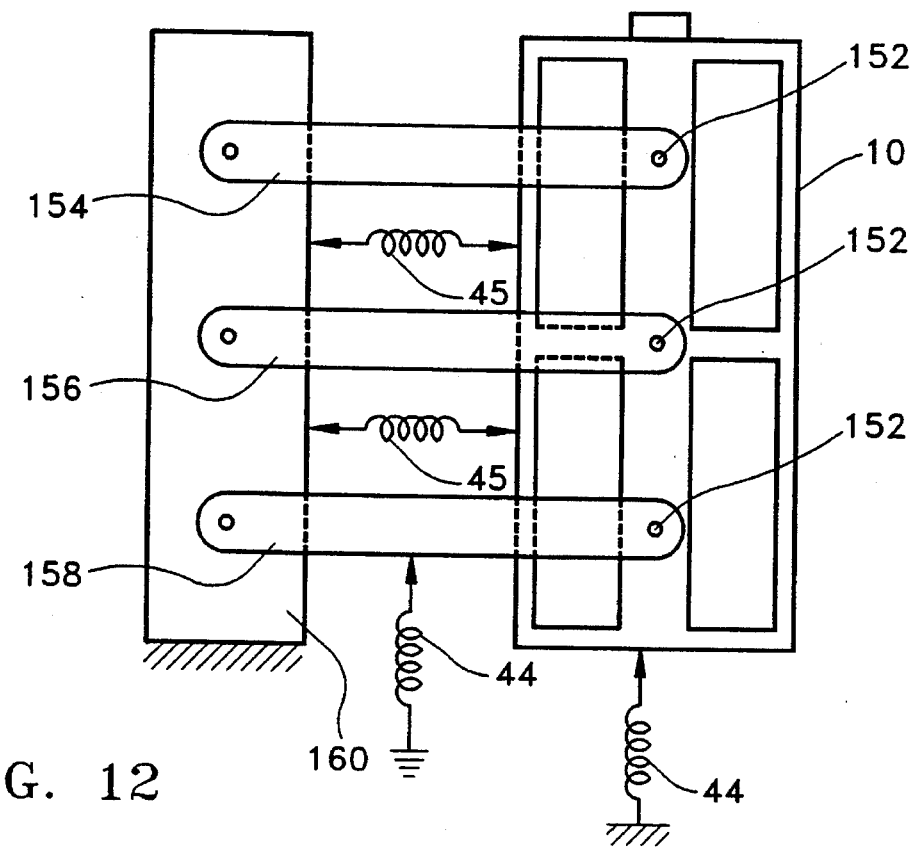
FIG. 12 shows an alternative method for mounting piezoelectric ceramics in accordance with a preferred embodiment of the invention.

An alternative mounting method, suitable for both single and multiple ceramic motors is shown in FIG. 12. In this mounting method holes are formed in piezoelectric ceramic 10 at the center of the ceramic and at the ⅙ and ⅚ points of the longitudinal center line of ceramic 10. These holes preferably have a diameter of between 20% and 30% % of the width of ceramic 10. Pins 152 having a clearance of about ±100 micrometers are placed in the holes and have at least one end attached to one end of levers 154, 156 and 158. Preferably the pins are made of a material having an acoustic velocity equal to the velocity in ceramic 10. The pins may be of metal or ceramic or any other suitable material.

For the resonance of ceramic 10 which is used in the preferred embodiment of the invention, the ceramic has movement only in the direction of its long axis at the holes. The center hole, in fact, experiences substantially no movement. If the other end of the levers are rotationally attached to a fixed body 160, then ceramic 10 is constrained to move only along its longitudinal axis. This allows for springs 36 and 38 to be omitted. Furthermore, spring 44 may be replaced by a spring 44' which urges one of the levers in the direction of the object to be moved and thus loads the motor against the object to be moved. A plurality of such springs may be used to load other of the levers.

Figure 13:
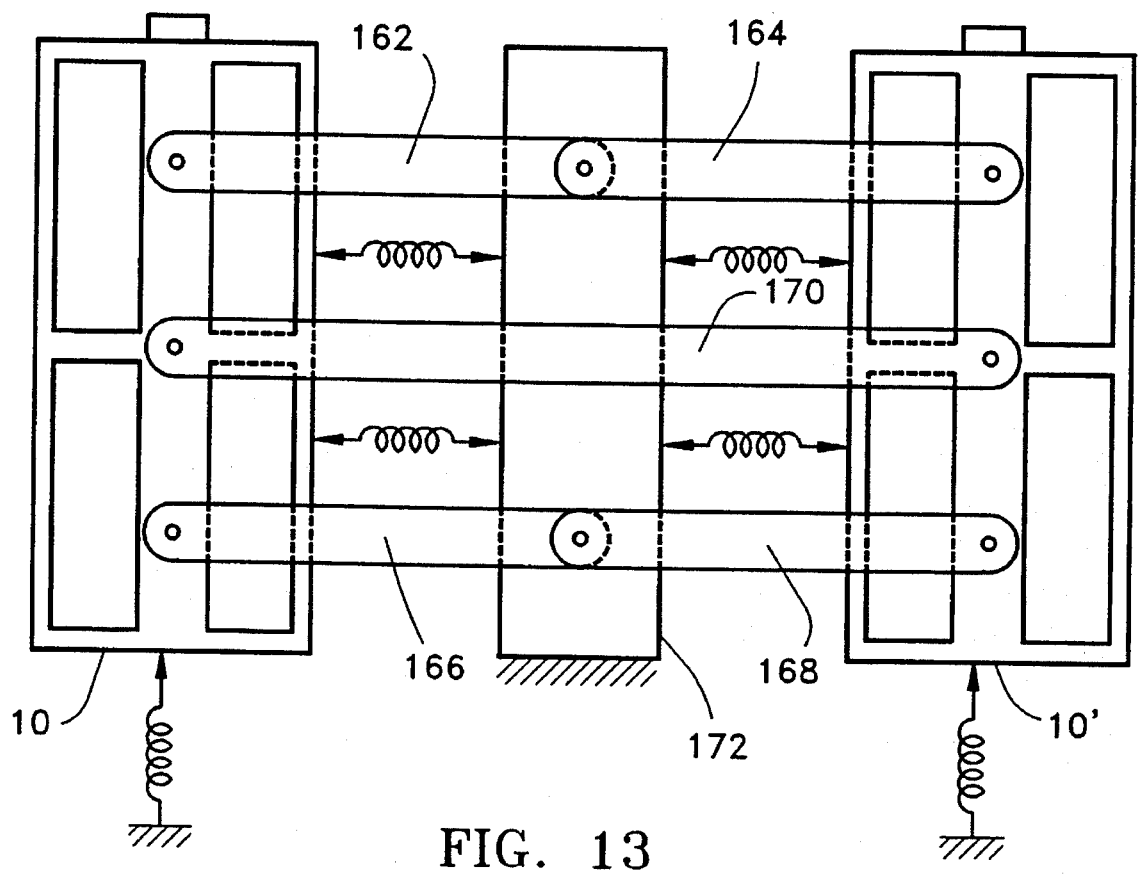
FIG. 13 shows an application of the mounting principle shown in FIG. 12 to mounting two piezoelectric ceramics.

The same principles may be applied to a simplified mounting of two side-by-side piezoelectric ceramic elements 10 and 10' as shown in FIG. 13. In this configuration piezoelectric ceramics 10 and 10' are mounted on five levers 162, 164, 166, 168 and 170 using the method described above. It should be noted that lever 170 is a single lever which is preferably attached to the center of both ceramics and fixedly attached at its center to a plate 172. The other levers are rotatably attached at one end to a hole in one of the ceramics and are rotatably attached at their other ends to plate 172. Each of ceramics 10 and 10' is separately loaded by a spring 44 at their lower ends.

In an alternative configuration, ceramics 10 and 10' are not spring loaded. However, plate 172, which is constrained to move only in the vertical direction, is loaded by a spring (not shown) at its lower end, in order to load ceramics 10 ad 10' against the object to be moved. A wide variety of mounting methods, using the lever principle of these preferred embodiments, will of course occur to a person of skill in the art.

A major benefit of mounting the piezoelectric ceramics on pins as described above is the significant reduction of temperature of the ceramics which is achieved by conduction of heat from the attachment points, which are also hot spots in the preferred mode of operation. In particular, it has been found that the temperature of these points can be reduced from 50°–80° C. to about 30° C. by using this method.

The cooling effect of the pins is enhanced when heat conduction from the ceramic to the pins is good. In order to assure such conduction, the pin should be fitted into a conducting relatively soft material such as an elastomer which coats the inner wall of the holes. One such suitable material is epoxy in which an insufficient amount of hardener is used. Such material elastic enough to take up the small partial rotations of the pins in the holes. In a preferred embodiment of the invention, the epoxy is filled with about 40% of PZT powder (of the same material as the piezoelectric ceramic itself). Such filling helps to match the acoustic velocity of the epoxy to that of the piezoelectric ceramics.

It has also been found that the motion of the device to be moved can be estimated based on the amount of time that the ceramic 26 is in contact with the object to be moved. To facilitate such a measurement, the surface of ceramic facing the object to be moved is coated with metal and an electrode is attached to this coating which extends, for this purpose to the side of ceramic 26. The object to be moved is of metal (or has a metal coating) and the time of contact can thus be measured as the time during which there is a short circuit between the metal coating of ceramic 26 and the object to be moved.

Figure 14A:
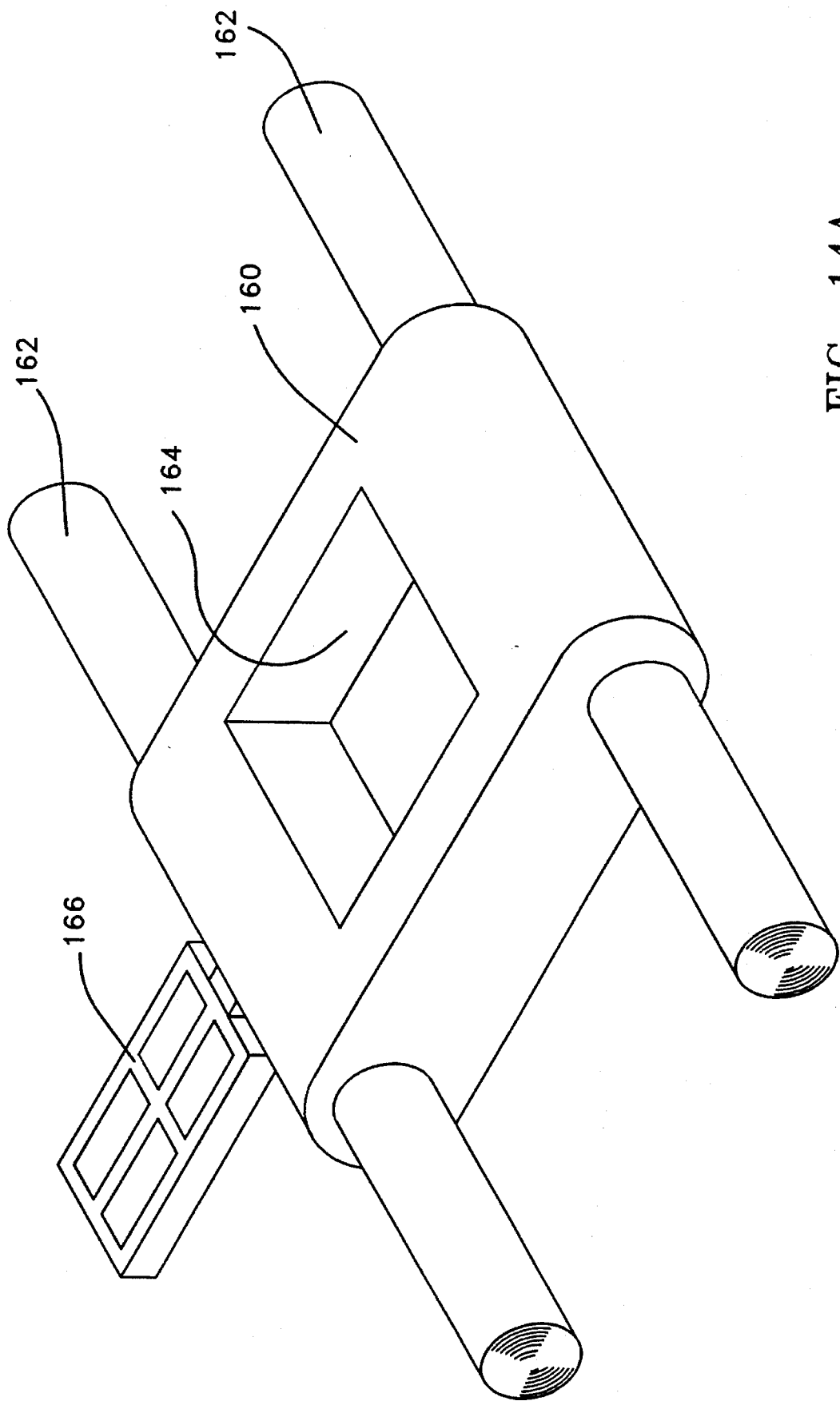
FIGS. 14A, 14B and 14C show alternative configurations for using a ceramic motor in a stage of a CD reader in accordance with a preferred embodiment of the invention.
Figure 14B:
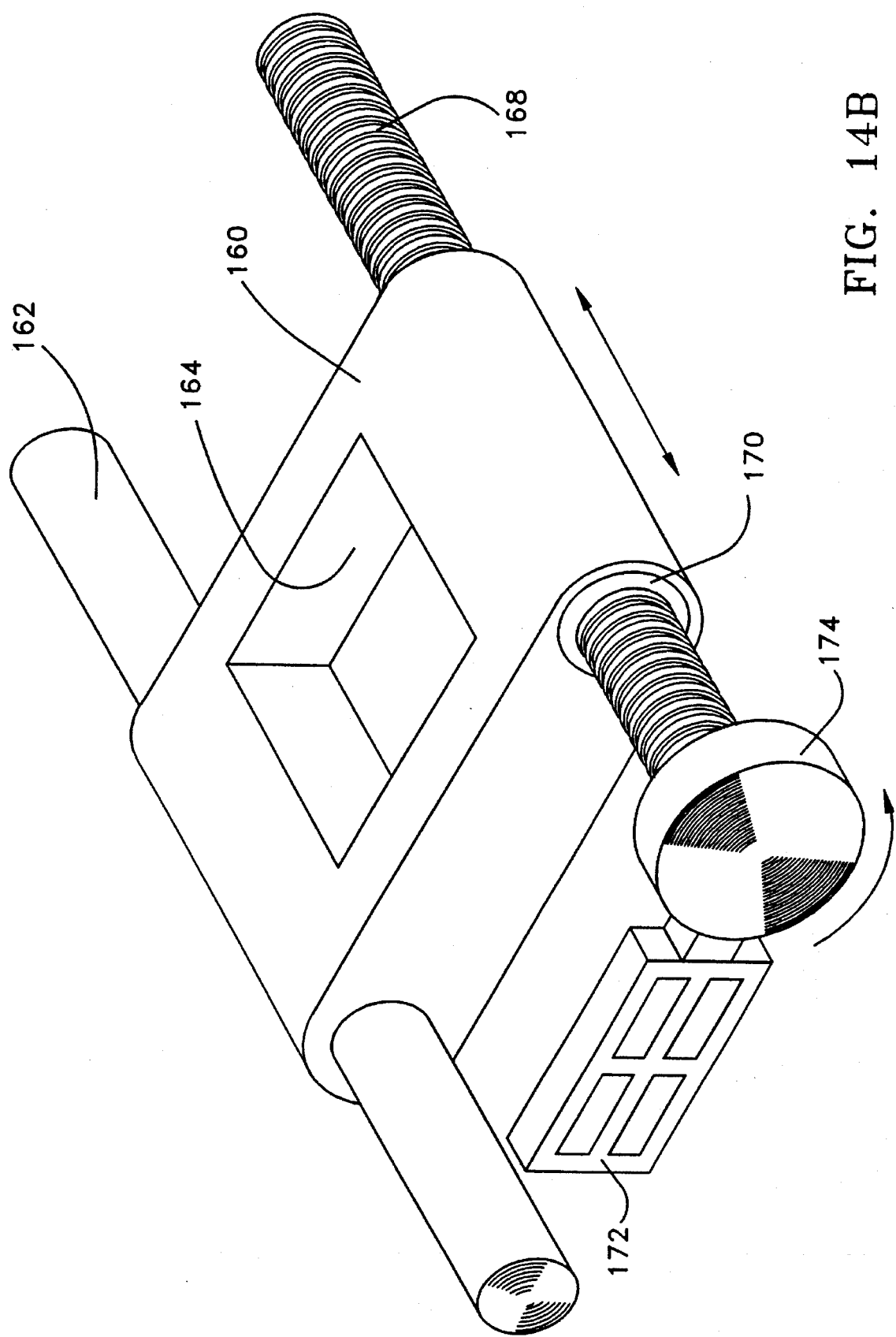
Figure 14C:
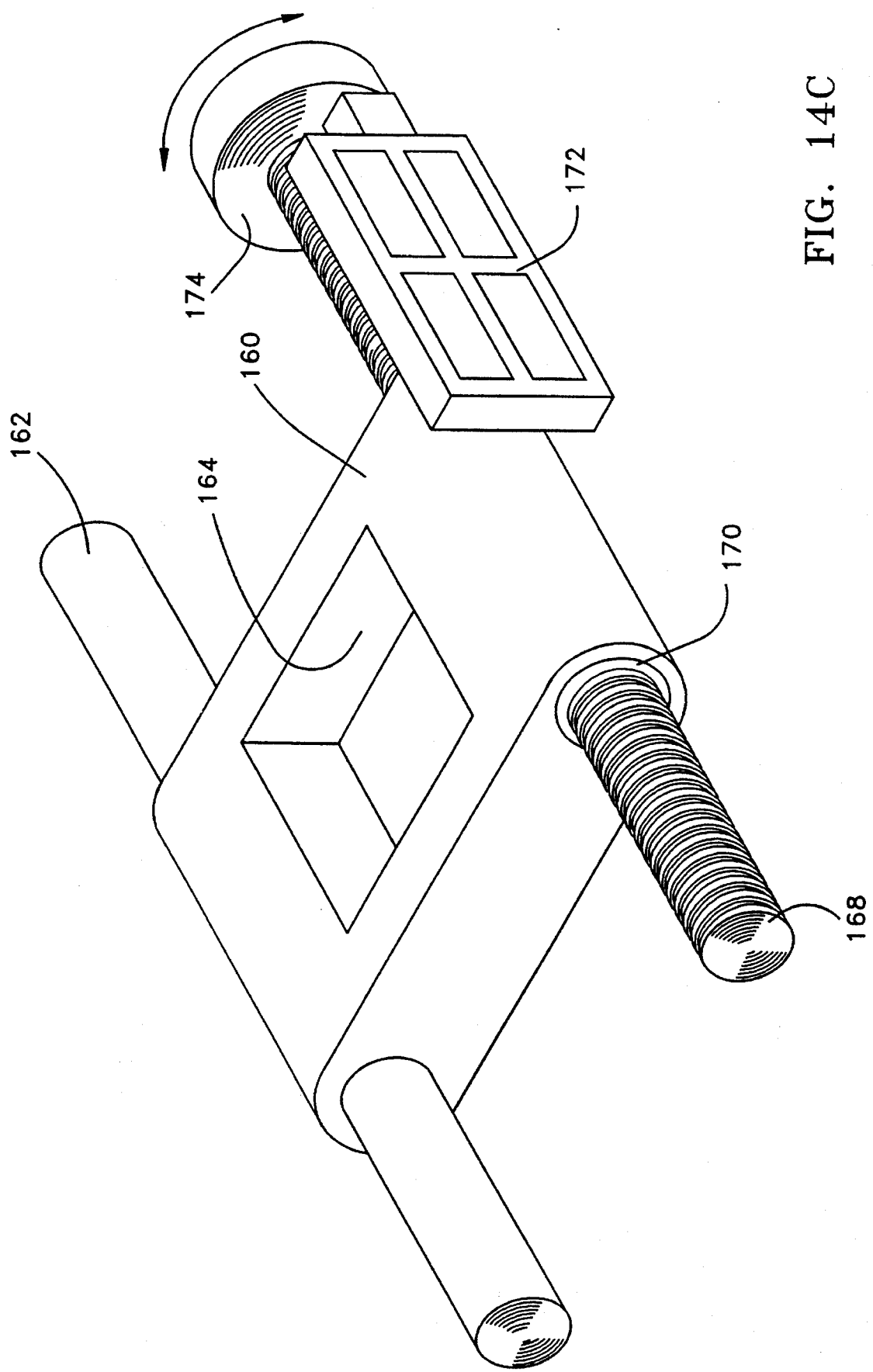

FIGS. 14A, 14B and 14C show the application of a ceramic motor to the movement of a stage, such as that used in an optical disk reader such as a CD reader. In such a device a stage 160 is mounted on at least one rail such as a rod 162. Stage 160 is formed with a hole 164 through which an optical reader (not shown for simplicity) which is mounted on stage 160 views (and reads) an optical disk.

In FIG. 14A stage 160 is mounted on two rails 162 and a ceramic motor 166, which is preferably of one of the types described herein, is operatively associated with one edge of stage 160 so as to cause movement of the stage along the rails.

In FIGS. 14B and 14C one side of stage 160 is mounted on a rail and the other side is mounted on a worm 168 via a rack 170. A ceramic motor 172, which is preferably of one of the types described herein, drives a wheel 174 mounted on one end of the worm. FIGS. 14B and 14C differ in the manner in which the motor drives the wheel.

It will be appreciated by persons skilled in the art that the present invention is not limited by what has been particularly shown and described herein. Rather the scope of the present invention is defined only by the claims which follow:

I claim:
1. A micromotor for moving a body comprising:
a piezoelectric plate having:
first and second faces, wherein at least a portion of said first face is divided into four quadrants;
long and short edges;
four electrodes attached to said first face, one electrode attached to each quadrant of said first face; and
mounting holes formed in said piezoelectric plate, spaced along an axis which is parallel to said long edges and is situated in the space between adjacent electrodes attached to said first face.
2. A micromotor according to claim 1 wherein said piezoelectric plate is supported by pins extending through said mounting holes.
3. A micromotor according to claim 1 comprising at least one lever having two ends thereof, a first end being rotatably mounted in one of said mounting holes.
4. A micromotor according to claim 3 wherein the second end of said lever is rotatably mounted onto a fixed plate.
5. A micromotor according to claim 3 wherein the second end of the lever is rotatably mounted onto a plate which is constrained to move only in a direction parallel to said long edges of said piezoelectric plate.
6. A micromotor according to claim 1 comprising a spacer attached to the center a first short edge.
7. A micromotor according to claim 6 comprising a source of resilient force which engages the second short edge opposite the first short edge.
8. A micromotor for moving a body comprising:
a rectangular piezoelectric plate having:
first and second faces, wherein at least a portion of said first face is divided into four quadrants;
two long and two short edges;
a spacer attached to a first short edge;
four electrodes attached to said first face, one electrode attached to each quadrant of said first face;
an electrical power supply which electrifies at least two electrodes on said first face; and
wherein a first pair of diagonally situated electrodes are electrified with an AC voltage and a second pair of diagonally situated electrodes are electrically grounded.
9. A micromotor comprising:
a rectangular piezoelectric plate having:
first and second faces, wherein at least a portion of said first face is divided into four quadrants;
two long and two short edges;
four electrodes attached to said first face, one electrode attached to each quadrant of said first face;
an electrical power supply which electrifies at least two electrodes on said first face; and
wherein a first pair of diagonally situated electrodes are electrified with a unipolar voltage and a second pair of diagonally situated electrodes are electrically grounded.
10. A micromotor comprising:
a rectangular piezoelectric plate having:
first and second faces, wherein at least a portion of said first face is divided into four quadrants;
two long and two short edges;
four electrodes attached to said first face, one electrode attached to each quadrant of said first face;
an electrical power supply which electrifies at least two electrodes on said first face; and
wherein a first pair of diagonally situated electrodes are electrified with a unipolar voltage and a second pair of diagonally situated electrodes are electrically floating.
11. A micromotor comprising:
a rectangular piezoelectric plate having:
first and second faces, wherein at least a portion of said first face is divided into four quadrants;
two long and two short edges;
four electrodes attached to said first face, one electrode attached to each quadrant of said first face;
an electrical power supply which electrifies at least two electrodes on said first face; and
wherein electrodes along a first long edge are electrified with a unipolar voltage of a first polarity.
12. A micromotor according to claim 11 wherein electrodes along a second long edge opposite the first long edge are electrified with a unipolar voltage of a second polarity opposite the first polarity.

13. A micromotor comprising:

a rectangular piezoelectric plate having:

first and second faces, wherein at least a portion of said first face is divided into four quadrants;

two long and two short edges;

four electrodes attached to said first face, one electrode attached to each quadrant of said first face;

an electrical power supply which electrifies at least two electrodes on said first face; and wherein electrodes lying a long edge are electrified with unipolar voltages of opposite polarities.

14. A micromotor comprising:

a rectangular piezoelectric plate having:

first and second faces, wherein at least a portion of said first face is divided into four quadrants;

two long and two short edges;

four electrodes attached to said first face, one electrode attached to each quadrant of said first face;

an electrical power supply which electrifies at least two electrodes on said first face; and wherein at least one of said electrodes is electrified with a unipolar voltage.

15. A micromotor for moving a body comprising:

a first rectangular piezoelectric plate and a second rectangular piezoelectric plate, each plate having:

long and short edges and first and second faces, wherein said first face of said first plate is parallel to said first face of said second plate;

electrodes attached to the first and second faces; and a spacer attached to the center of a first one of the edges;

means for applying resilient force to the center of a second edge opposite the first edge, whereby the spacer is pressed against the body; and means for electrifying at least some of the electrodes so that the spacer on the first plate and the spacer on the second plate move out of phase with each other, whereby more continuous motive force is applied to the body by the micromotor.

16. A micromotor according to claim 15, wherein said first plate has a different hardness from said second plate.

\* \* \* \* \*